(12) United States Patent
Shimizu

(10) Patent No.: US 8,089,117 B2
(45) Date of Patent: Jan. 3, 2012

(54) SEMICONDUCTOR STRUCTURE

(75) Inventor: Takashi Shimizu, Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 723 days.

(21) Appl. No.: 12/065,901

(22) PCT Filed: Aug. 22, 2006

(86) PCT No.: PCT/JP2006/316352
§ 371 (c)(1),
(2), (4) Date: Apr. 22, 2008

(87) PCT Pub. No.: WO2007/029482
PCT Pub. Date: Mar. 15, 2007

(65) Prior Publication Data
US 2009/0134465 A1 May 28, 2009

(30) Foreign Application Priority Data
Sep. 6, 2005 (JP) .................. 2005-257580

(51) Int. Cl.
*H01L 29/49* (2006.01)
(52) U.S. Cl. .............. 257/316; 257/412; 257/E29.3; 257/E29.16; 257/E29.129; 257/E21.623
(58) Field of Classification Search .............. 438/267, 438/593; 257/316, 412, E29.3, E29.129, 257/E29.16, E21.623
See application file for complete search history.

(56) References Cited

U.S. PATENT DOCUMENTS

| | | | | |
|---|---|---|---|---|
| 5,214,305 A | * | 5/1993 | Huang et al. | 257/413 |
| 5,541,131 A | * | 7/1996 | Yoo et al. | 438/305 |
| 5,576,228 A | * | 11/1996 | Chen et al. | 438/302 |
| 5,892,244 A | * | 4/1999 | Tanaka et al. | 257/40 |
| 5,897,354 A | * | 4/1999 | Kachelmeier | 438/264 |
| 5,929,477 A | * | 7/1999 | McAllister Burns et al. | 257/306 |
| 6,103,609 A | * | 8/2000 | Lee et al. | 438/592 |
| 6,440,801 B1 | * | 8/2002 | Furukawa et al. | 438/272 |
| 6,656,796 B2 | * | 12/2003 | Chan et al. | 438/266 |
| 7,005,330 B2 | * | 2/2006 | Yeo et al. | 438/157 |
| 7,148,526 B1 | * | 12/2006 | An et al. | 257/288 |
| 7,172,943 B2 | * | 2/2007 | Yeo et al. | 438/300 |

(Continued)

FOREIGN PATENT DOCUMENTS
JP 62-181782 8/1987
(Continued)

*Primary Examiner* — George Fourson, III
(74) *Attorney, Agent, or Firm* — Oblon, Spivak, McClelland, Maier & Neustadt, L.L.P.

(57) ABSTRACT

A desired property for a metal gate electrode layer is that it can cover a three-dimensional semiconductor structure having a microstructure with high step coverage. Another desired property for the metal gate electrode layer is that the surface of a deposited electrode layer is flat on a nanometer scale, enables a dielectric layer for electrical insulation to be coated without performing special planization after deposition of the electrode layer. Furthermore, another desired property for the metal gate electrode layer is that it has the similar etching workability to materials used in an ordinary semiconductor manufacturing process. Furthermore, another desired property for the metal gate electrode layer is that it has a structure in which diffusion of impurity is suppressed due to homogeneity thereof and the absence of grain boundaries. It was found that an amorphous metal electrode is most suitable for realizing the metal gate electrode layer satisfying the above-mentioned properties and thereby the present invention was achieved.

6 Claims, 12 Drawing Sheets

U.S. PATENT DOCUMENTS

| | | | |
|---|---|---|---|
| 7,259,425 B2 * | 8/2007 | An et al. | 257/341 |
| 7,397,090 B2 * | 7/2008 | Mathew et al. | 257/369 |
| 7,504,302 B2 * | 3/2009 | Mathew et al. | 438/257 |
| 7,659,215 B2 * | 2/2010 | Kim et al. | 438/778 |
| 7,719,065 B2 * | 5/2010 | Ahn et al. | 257/411 |
| 7,833,891 B2 * | 11/2010 | Cheng et al. | 438/591 |
| 2001/0036728 A1 * | 11/2001 | Shinmura et al. | 438/660 |
| 2005/0184316 A1 | 8/2005 | Kim et al. | |
| 2010/0224944 A1 * | 9/2010 | Ahn et al. | 257/411 |

FOREIGN PATENT DOCUMENTS

| | | |
|---|---|---|
| JP | 2001-332636 | 11/2001 |
| JP | 2003-273350 | 9/2003 |
| JP | 2005-045263 | 2/2005 |

\* cited by examiner (a) Deposited at 300 °C for 15minutes (b) Deposited at 260 °C for 15 minutes (c) Deposited at 240 °C for 90 minutes (d) Deposited at 200 °C for 90 minutes (a)

(b)

(c)

(a)           (b)

(g)

(h)

SEMICONDUCTOR STRUCTURE

TECHNICAL FIELD

The present invention relates to a device constituting an integrated circuit and a method for manufacturing the integrated circuit, and more specifically, to a gate electrode of a transistor device.

BACKGROUND ART

Polysilicon is the most popular and effective material for electrodes to date and has been used to manufacture integrated circuits. This film has high reliability, and, in particular, the electric resistivity of electrodes and the position of the Fermi level thereof can be controlled by selecting a type of impurity which generates carriers and controlling a doping level. Furthermore, since the film can be deposited by CVD, the film can cover a three dimensionally structured body having a microstructure with high step coverage. Therefore, polysilicon has been the most popular and effective material to date for gate electrodes.

Presently, the thickness of gate insulating films become extremely thin in accordance with a reduction of device size, in the case that impurity-doped polysilicon is used as a gate electrode, it is thought that a minute depletion region formed in the electrode or a small amount of impurity that diffuses into a semiconductor channel region through a gate insulating film will become an obstacle to improving device performance. In particular, using polysilicon for activating carriers contained therein requires depositing or annealing at a high temperature and such a process under the high temperature facilitates a diffusion of the impurity.

Furthermore, since a tunnel leakage current flowing through the gate dielectric film increases in accordance with a miniaturization of the thickness of the gate insulating film, introduction of a high-k gate insulating film will be indispensable to the 65 nm-node micro semiconductor devices from the year 2007. Therefore, recently, numerous studies have been conducted to develop a high-k gate insulating film having a higher dielectric constant than silicon oxide. Then it is found that, if polysilicon is deposited on the high-k gate dielectric film and used as a gate electrode, a problem of pinning of the Fermi level occurs and an improvement of device performance is suppressed. To the 65 nm-node micro semiconductor devices from the year 2007, an introduction of a metal gate electrode will be indispensable. Therefore, presently, numerous studies are being conducted to develop the metal gate material as an alternative material to polysilicon, in which gate depletion and the diffusion of impurity into the semiconductor channel region do not occur, and the pinning phenomenon of the Fermi level does not occur at the high-k gate insulating film.

Metal gate electrode materials generally have a resistivity of 1 mΩcm or lower and this resistivity is lower than that of polysilicon having a resistivity of about 1 mΩcm. Furthermore, the materials have an advantage that the gate depletion does not occur. On the other hand, usually, it is difficult to largely change the position of the Fermi level, because the Fermi level is inherent to the material. Regarding the problem of the diffusion of metal atoms into a semiconductor channel region, it will require some manufacturing ingenuities such as; composing a material used for an electrode of an element having a small diffusion coefficient in a gate dielectric film or in a semiconductor channel region, and not performing a high temperature process should not be performed after deposition of a metal gate electrode film. These manufacturing processes should be carefully designed.

Meanwhile, another problem caused by recent size reduction of transistor devices is a short channel effect. In order to suppress the short channel effect, in which a leakage current flows through a substrate, a structure including an additional gate electrode placed at a position facing a channel, as shown in FIGS. 1(b) and 1(c), has been suggested. Such FETs are called double-gate FETs and categorized into three types of FETs as shown in FIG. 1, on the basis of a positional relation in the structure between gate electrodes and a semiconductor channel.

Among the three types, a structure shown in FIG. 1(b) can be manufactured most easily. In order to manufacture such a device, a manufacturing process must include a step of depositing a dielectric layer and an electrode layer on both side faces of a semiconductor standing on a substrate and a step of depositing an interlayer insulating film, a wiring, and the like on the resulting structure. The introduction of these double-gate FETs (double-gate FETs shown in FIG. 1 are usually called finFETs) will be indispensable to 50 nm-node devices from the year 2009. Therefore, it is desirable to establish such a manufacture process of 50 nm device order including steps of depositing a dielectric layer and an electrode layer on both side faces of the semiconductor standing on the substrate and a following step of depositing the interlayer dielectric film, wiring layer, and the like on the resulting structure.

That is, when a device size is 65 nm, manufacturing accuracy of the metal electrode layer is also required to correspond to 65 nm. Since the manufacturing accuracy is generally 4% or less, a required dimensional manufacturing accuracy is about 2.5 nm. Note that, the manufacturing accuracy of the metal electrode layer is usually referred to as accuracy of film thickness, and generally corresponds to accuracy of flatness. In order to manufacture devices on 65 nm scale, an etching process is also required to be performed on the 65 nm scale. Therefore, it is obvious that the metal electrode layer is also required to be etched on the 65 nm scale.

In order to manufacture a nanometer-scale semiconductor device, nanometer-scale homogeneity is also required. It is known that an insulating dielectric film composed of amorphous material is more homogeneous than one composed of polycrystalline material because the amorphous material has no influence associated with crystal grain boundaries thereof (refer to Patent Document 1 described below).

Therefore, for the electrode material, the amorphous material would be superior to the polycrystalline material in homogeneity. The crystal grain boundaries of the electrode material may play a central role in the pinning of the Fermi level and the role as fixed charges in an interface between an electrode and the insulating dielectric film. Furthermore, it is commonly known that the amorphous material can more effectively serve as a barrier layer against diffusion of impurity atoms than the polycrystalline material since crystal grain boundaries are regions into which impurity atoms are easily diffused.

Therefore, when the gate electrode is composed of polycrystalline, impurities may diffuse into the gate electrode through the crystal grain boundaries from materials contacting surfaces of the gate electrode other than the contact surface of the gate dielectric film. The diffused impurity may serve as the center responsible for the pinning of the Fermi level in the interface between the electrode and the insulating dielectric film. On the other hand, when the gate electrode is composed of amorphous material, such a diffusion of the impurity can be suppressed resulting in the prevention of the pinning of the Fermi level and the increase of the fixed charges.

Patent Document 1: Japanese Unexamined patent Application Publication (Translation of PCT Application) No. 2003-533046

Patent Document 2: Japanese Unexamined patent Application Publication No. 2005-150688

Non-Patent Document 1: T. N. Arunagiri et al. Appl. Phys. Lett. 86 (2005) 083104.

DISCLOSURE OF INVENTION

In consideration of the above, one of the desired properties for the metal gate electrode layer, which can realize reduction of a device size further to existing semiconductor devices having polysilicon electrodes, is that it is depositable on a three-dimensional semiconductor structure having a microstructure with high step coverage. Another desired property for the metal gate electrode layer is that a surface of a deposited electrode layer is flat on a nanometer scale, so that a dielectric layer for electrical insulation can be coated without performing special planization after deposition of the electrode layer. Further desired property for the metal gate electrode layer is that it has the etching workability similar to materials used in an ordinary manufacturing process of semiconductor devices. Further desired property for the metal gate electrode layer is that it has a structure in which diffusion of impurity is suppressed due to homogeneity thereof and the absence of grain boundaries.

It was found that an amorphous metal electrode is most suitable for realizing the metal gate electrode layer satisfying the above-mentioned properties and thereby the present invention was conducted.

That is, in the present invention, as a desirable embodiment of the metal gate electrode layer having a surface roughness of 2.5 nm and deposited on a semiconductor device with a three dimensionally structured body having a length of 65 nm or less with high step coverage, a metal gate electrode layer having an amorphous structure and a resistivity of 1 mΩcm or lower is formed. Furthermore, in the present invention, as another desirable embodiment of the metal gate electrode layer having a surface roughness of 3 nm and deposited on a semiconductor device with a three dimensionally structured body having a length of 70 nm or less with high step coverage, a metal gate electrode layer having a laminated structure including an amorphous structure and a polycrystalline structure and a resistivity of 1 mΩcm or lower is formed.

A metal having an amorphous structure generally has higher resistivity than a metal having a crystal (polycrystalline) structure with the same composition. Therefore, the metal having an amorphous structure has a disadvantage from the viewpoint of generation of Joule heat or delay when applied to semiconductor devices. However, although generally inferior to a single-crystal metal, the metal having an amorphous structure has excellent flatness of surface and homogeneity of electric characteristics compared with a polycrystalline material having many crystal grain boundaries and crystal grain size of which is hard to control. In the case that a structure includes laminated polycrystalline materials, there is a problem that atoms of an element contacting an upper portion of a polycrystalline body can easily pass through the interior of the polycrystalline material via crystal grain boundaries and diffuse into a structure disposed under (over) the polycrystalline material.

On the other hand, in the case of an amorphous structure or amorphous/polycrystalline laminated structure, since the amorphous structure does not have crystal grain boundaries, the above-mentioned problem of diffusion does not occur. Therefore, the amorphous structure also functions as a barrier layer. In consideration of the above, desirable properties for a newly developed gate electrode layer applicable to a three dimensionally structured body with a length of 70 nm or less are as follows.

The gate electrode layer has an amorphous structure, resistivity thereof is smaller than that of polysilicon, step coverage thereof is similar to that of polysilicon, and a surface roughness thereof is 1 nm or less.

It is commonly known that a high-k gate insulating film is formed from an amorphous material because an amorphous structure has higher homogeneity than a crystalline structure. It is also known that by adding Si or Al atoms into a high-dielectric oxide enables to form amorphous high-dielectric oxide, which can be otherwise easily formed as a crystal.

This method involves a technique using the tendencies of Si and Al oxides to become amorphous. Therefore, considering that the oxides of Si or Al are insulators, it is obvious that the above-mentioned technique cannot be used to form an amorphous metal described in the present invention. It is known that silicide containing Si may induce formation of an amorphous structure (refer to Non-Patent Document 1). However, an invention disclosed in the document relates to a sputtering method using high-energy particles. An amorphous silicide electrode disclosed in the above-mentioned invention is a result of an experiment in which deposition of a monometal on a Si substrate is attempted. The amorphous silicide electrode is consequently formed by unintentional interlayer diffusion between a Si underlayer and a deposited metal.

Therefore, if the method described in the document is directly used to form a gate electrode, a gate insulating film serving as an underlayer may be damaged and the damage may cause an occurrence of leakage current or inadequate properties.

On the other hand, it is also known that an amorphous electrode material made of nitride such as TiN and TaN is used for a high-dielectric oxide dielectric or a barrier metal for wiring material. For example, a method of forming an amorphous barrier metal made of TiN by MOCVD or sputtering has been disclosed (refer to Patent Document 2).

However, an application to a gate electrode material, which is a subject matter of the present invention, is not known. That is, using the above-mentioned method involving the barrier metal for the gate electrode has problems as described below, which are also described in the above-mentioned Non-Patent Document.

<1> Since high energy particles hit a surface of a gate dielectric film during sputtering, a damaged layer is formed at an interface between the gate electrode and the gate insulating film. It increases roughness of the interface, forms a reduced layer, a reaction layer, and an impurity layer, and leads to an increase in leakage current and a large decrease in an effective dielectric constant of the entire gate insulator.

<2> Since source metal ions and source nitride ions are directly introduced onto the surface of the gate dielectric film by sputtering, a large amount of defects are generated in the gate insulating film and a large amount of fixed charges and trap levels are generated in the film, leading to more property failures.

These situations cause no problems when an underlayer is a barrier metal composed of a metal material. However, if the underlayer is the gate insulating film, these situations may pose a serious problem.

Then what are the conceivable techniques for obtaining an amorphous structure.

It is important to freeze a dynamically metastable structure before the structure turns into a most stable crystal thermodynamically. That is, it is important to provide an environment in which electrode material atoms (molecules) provided on a growth surface are held down by newly provided material atoms (molecules) and frozen before the previously provided atoms (molecules) align and stabilize at sites forming a stable crystalline structure by repeating surface diffusion. In order to provide this environment, it is desirable to suppress the diffusion length of diffusing species on the growth surface and to prevent the diffusing species from reaching stable sites. Thus, in the present invention, the amorphous metal was obtained by the following means.

(1) Since a monometal has many stable sites capable of forming a crystalline structure and a long diffusion length at the same deposition temperature, in the present invention, a compound metal was used as a material for the gate electrode. The compound metal has fewer stable sites capable of forming a crystalline structure than the monometal and a short diffusion length at the same deposition temperature.

(2) If an amount of source material provided is the same, the lower a deposition temperature is, the shorter a surface diffusion length of diffusion species becomes. If the deposition temperature is low, however, in the case of a compound metal, the reaction is insufficiently performed and many unreacted species remain on a substrate. Such an insufficiency in the amount of adhering deposited material easily causes a large reduction in a deposition rate and a large content of impurity atoms. Therefore, in the present invention, the reaction on the growth surface is accelerated by using activated particles to achieve high adhesion.

(3) If ions are used as the above-mentioned activated particles, an insulating dielectric body is easily damaged by the above-mentioned high-energy particles and the ions. Therefore, in the present invention, low energy neutral particles, specifically; electrically neutral ozone, atomic oxygen, ammonia, and atomic nitrogen were used as the activated particles. If necessary, ultraviolet-excited activated particles could also be introduced.

(4) If a deposition temperature is the same, the more a source material adheres to the substrate, the easier the source material freezes in a metastable structure. Therefore, in the present invention, the activated particles were supplied at a sufficient flux level to achieve an increase in the amount of deposit.

(5) If a deposition rate is the same, the greater the amount of provided atoms (molecules) is, i.e., the higher the deposition pressure is, the shorter a diffusion length becomes. This is due to collision of the diffusion species with other atoms (molecules) before moving a sufficient length on the surface of the substrate. Therefore, in the present invention, in order to achieve the amorphous structure, an inert gas composed of a material different to the source material was additionally provided over a surface of a substrate, and a surface-diffusion-suppressing gas was provided so as to deposit a thin film under a pressure of $10^1$ Torr or more.

In the present invention, as a desirable embodiment of the metal gate electrode layer having a surface roughness of 2.5 nm and deposited on a semiconductor device with a three dimensionally structured body having a length of 65 nm or less with high step coverage, a metal gate electrode layer having an amorphous structure and a resistivity of 1 mΩcm or lower can be formed. Furthermore, in the present invention, as another desirable embodiment of the metal gate electrode layer having a surface roughness of 3 nm and deposited on a semiconductor device with a three dimensionally structured body having a length of 70 nm or less with high step coverage, a metal gate electrode layer having a laminated structure composed of an amorphous structure and a polycrystalline structure and a resistivity of 1 mΩcm or lower can be formed.

Figure 6:
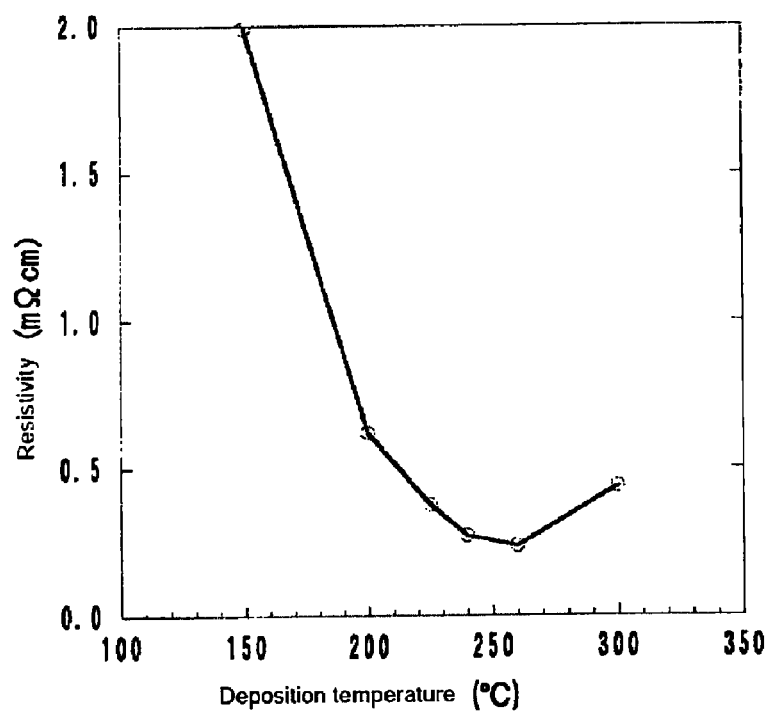
Figure 7:
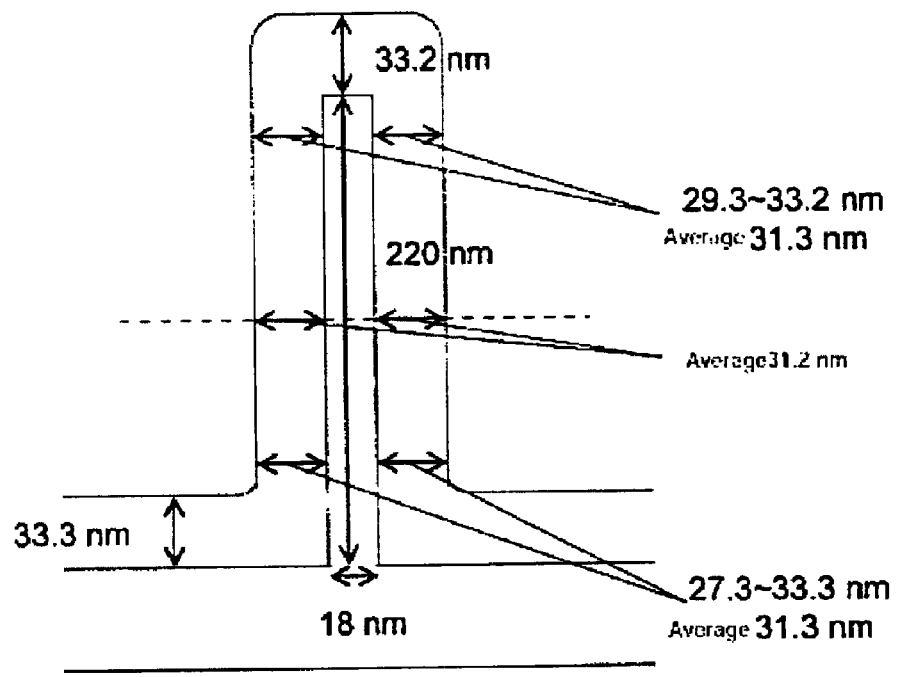
Figure 8:
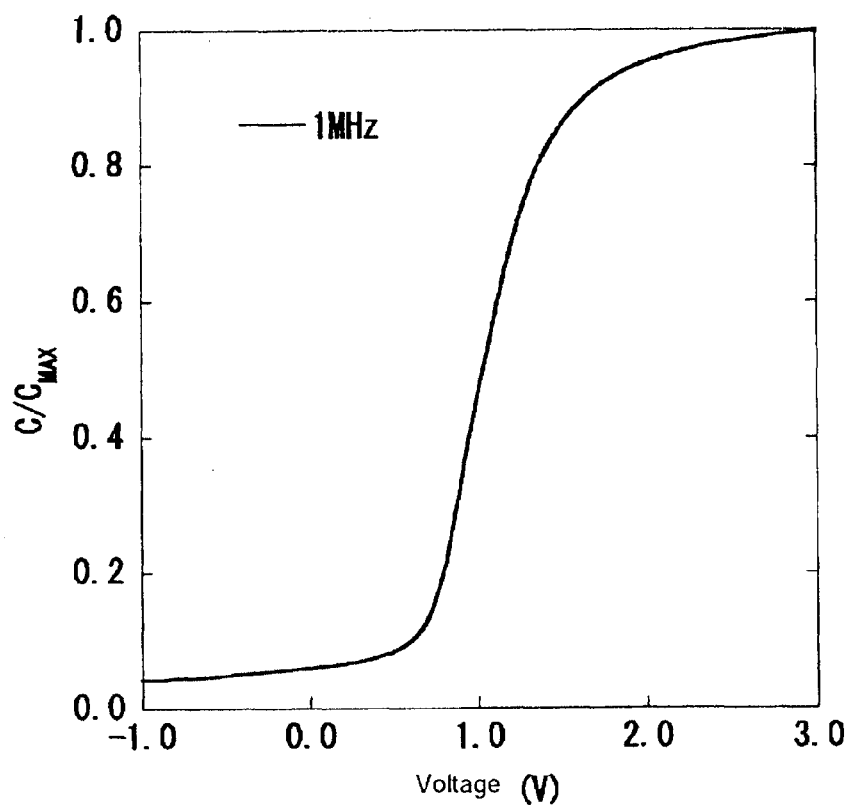
Figure 9:
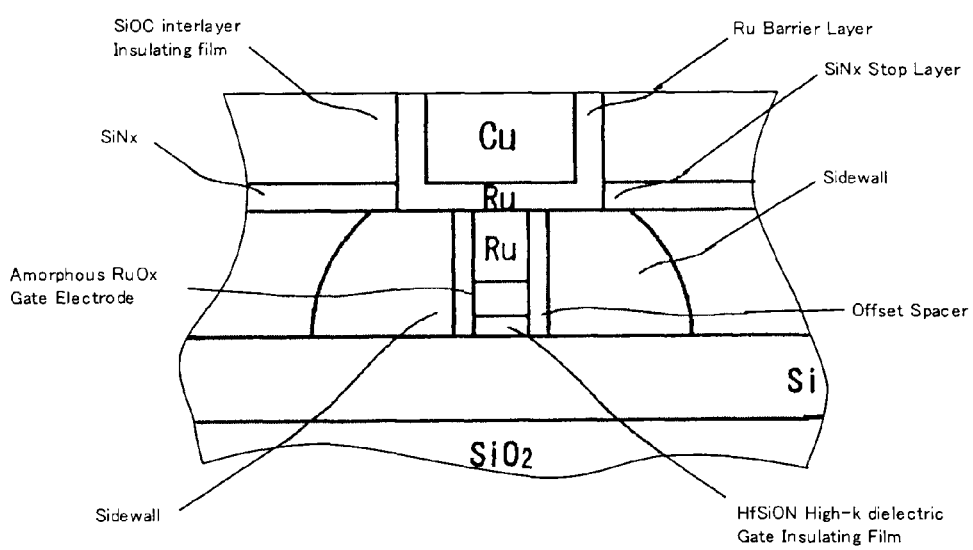
Figure 10:
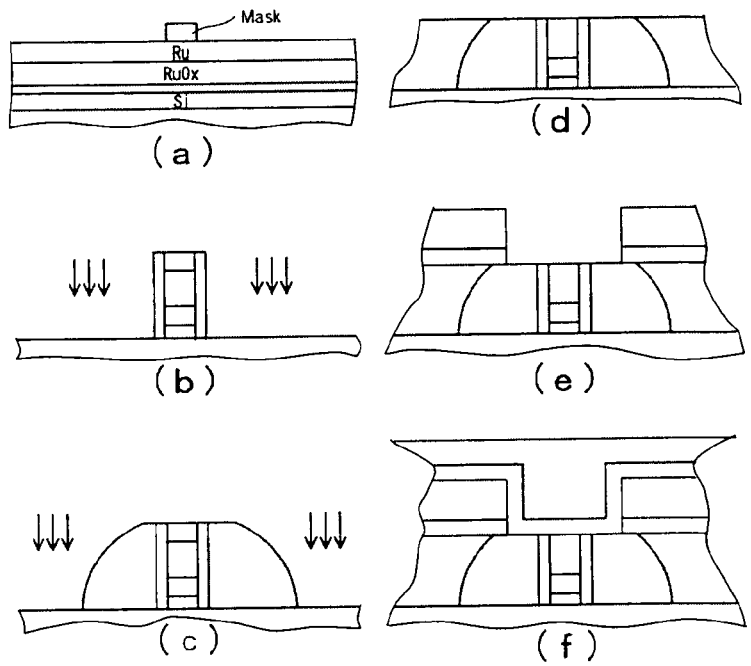
Figure 11:
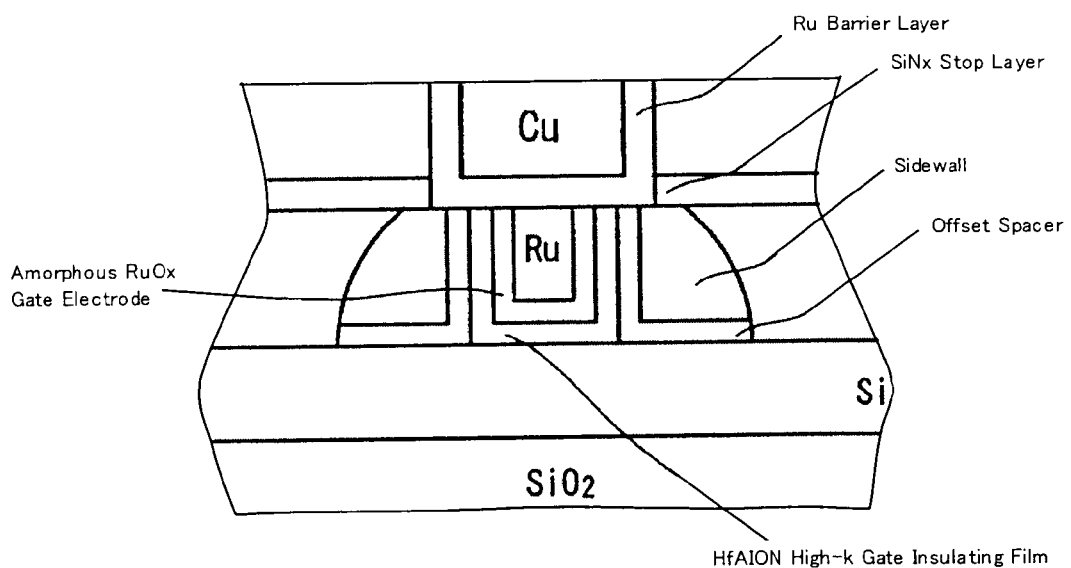
Figure 12:
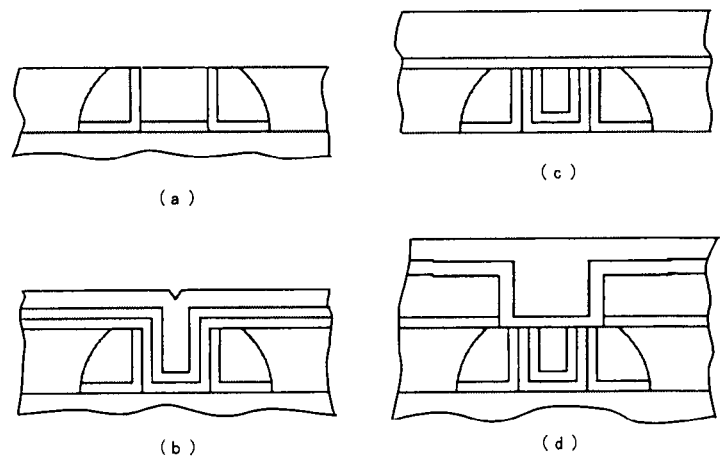
Figure 13:
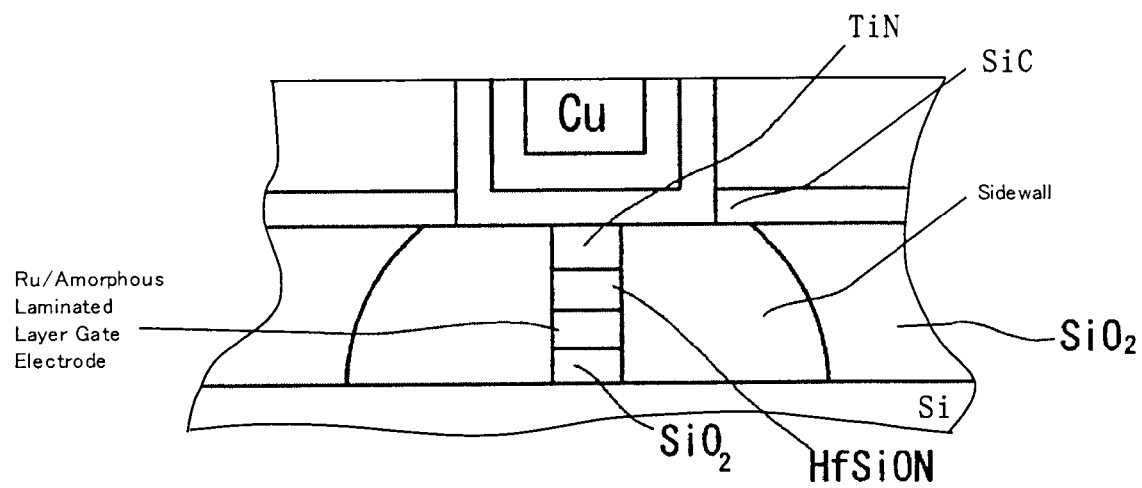
Figure 14:
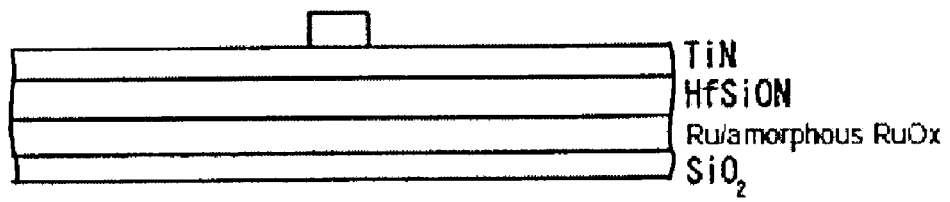
Figure 14:
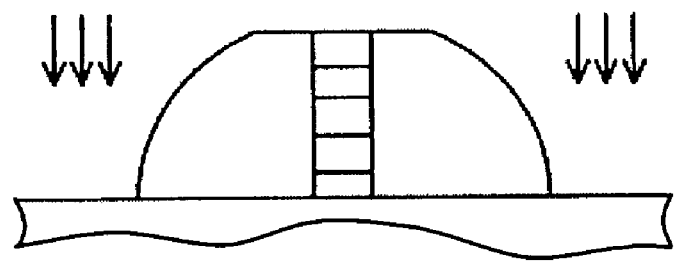
Figure 14:
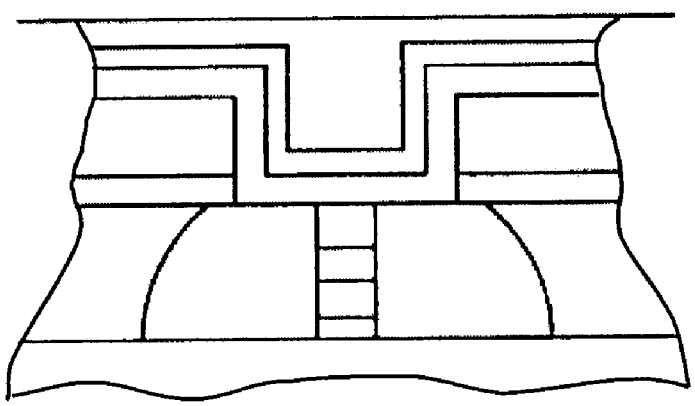
Figure 15:
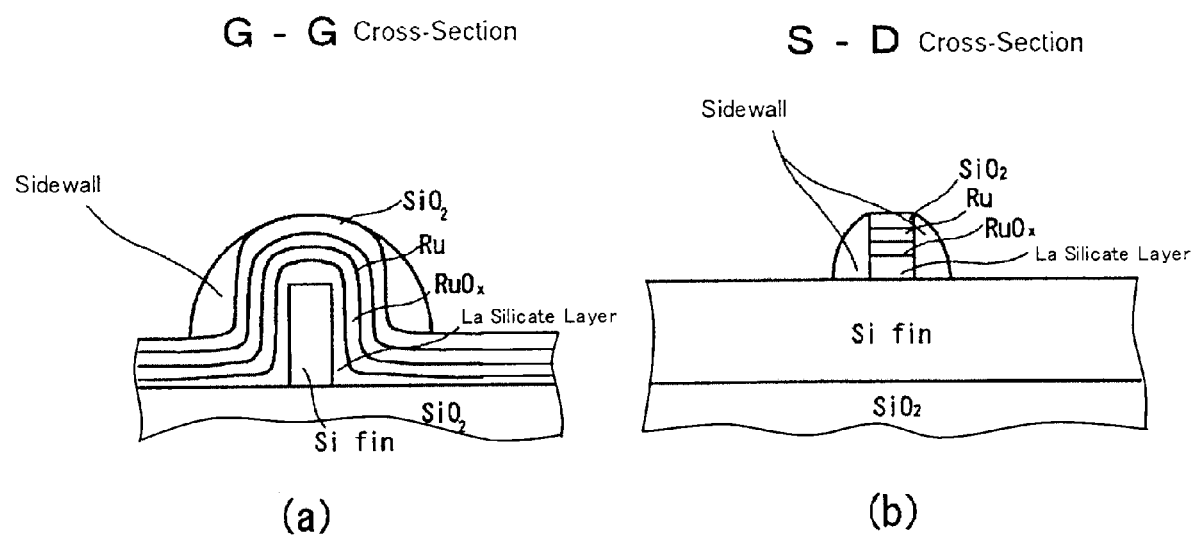
Figure 16:
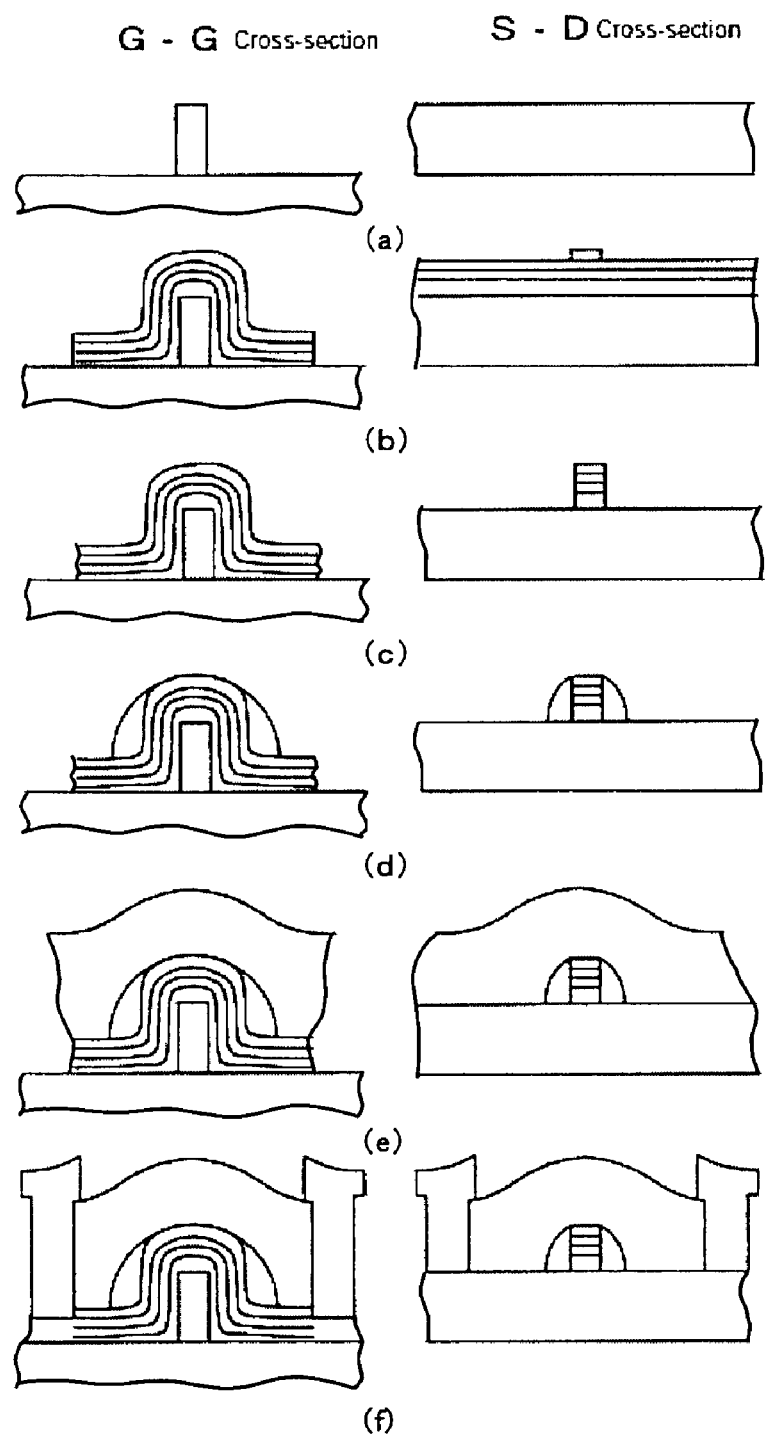
Figure 17:
Figure 17:
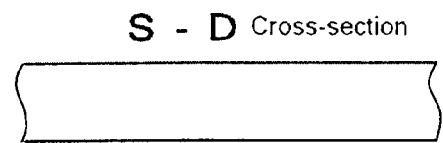
Figure 17:
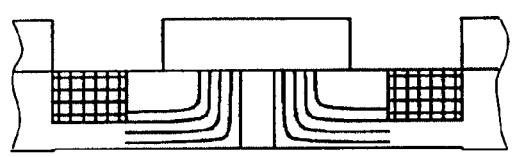
Figure 17:
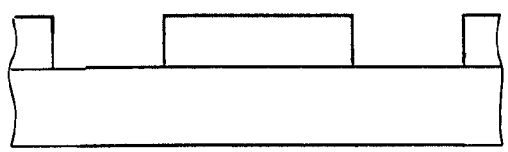
Figure 18:
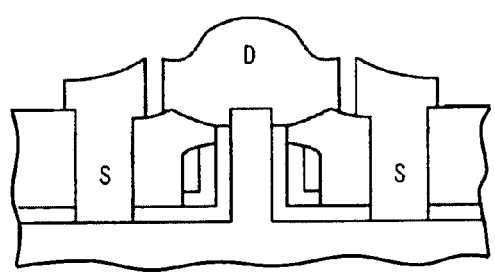
Figure 19:
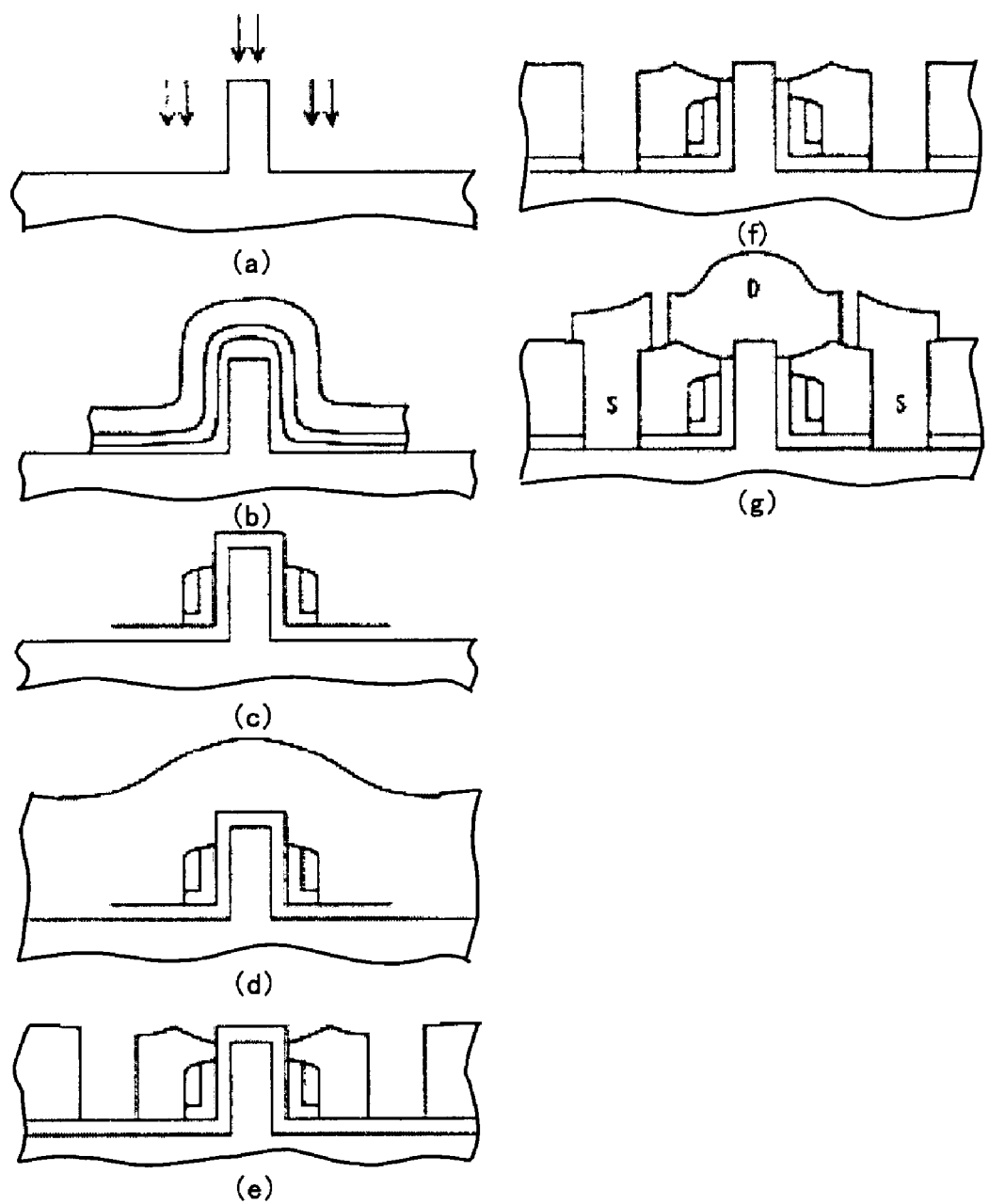

(a) a thin film deposited at a temperature of 300° C. for 15 minutes (b) a thin film deposited at a temperature of 260° C. for 15 minutes (c) a thin film deposited at a temperature of 240° C. for 90 minutes (d) a thin film deposited at a temperature of 200° C. for 90 minutes;

FIG. 6 shows deposition temperature dependence of resistivity of thin films measured by the four-terminal method at room temperature;

FIG. 7 shows a schematic cross-sectional TEM image of an amorphous $RuO_x$ thin film deposited by CVD on a silicon semiconductor standing on a substrate;

FIG. 8 shows a C-V characteristic of a MOS capacitor using amorphous $RuO_x$ for a gate electrode. The C-V characteristic is measured at a frequency of 1 MHz;

FIG. 9 shows an example of a MISFET having an amorphous $RuO_x$ gate electrode;

FIG. 10 shows an example of a manufacturing process of a MISFET having an amorphous $RuO_x$ gate electrode;

FIG. 11 shows an example of a MISFET having an amorphous $RuO_x$ gate electrode;

FIG. 12 shows an example of manufacturing process of a MISFET having an amorphous $RuO_x$ gate electrode;

FIG. 13 shows an example of a memory device having an amorphous $RuO_x$ floating gate;

FIG. 14 shows an example of a manufacturing process of a memory device having an amorphous $RuO_x$ floating gate;

FIG. 15 shows an example of a finFET having an amorphous $RuO_x$ gate electrode;

FIG. 16 shows an example of a manufacturing process of a finFET having an amorphous $RuO_x$ gate electrode;

FIG. 17 shows an example of a manufacturing process of a separate type double-gate transistor having an amorphous $RuO_x$ gate electrode;

FIG. 18 shows an example of a vertical FET having an amorphous $RuO_x$ gate electrode; and FIG. 19 shows an example of a manufacturing process of a vertical FET having an amorphous $RuO_x$ gate electrode.

BEST MODE FOR CARRYING OUT THE INVENTION

As an embodiment of the present invention, a method for forming an amorphous gate compound metal layer is disclosed below.

Embodiment 1

As amorphous compound metals, a Ru oxide was selected. $RuO_2$ is an example of a Ru oxide and has a rutile structure and exists as a compound metal. $RuO_2$ is already known as a material for electrodes using high-dielectric oxide and has been used in capacitors for DRAMs or in ferroelectric memories. All Ru oxide electrodes currently used, however, are polycrystalline materials and diffusion of impurity atoms along crystal grain boundaries occurs. Therefore, for example, in order to prevent diffusion of Pb atoms in a PZT ferroelectric body or diffusion of oxygen atoms from diffusing into a metal underlayer, a barrier metal such as TiN or TaN is required. If an amorphous Ru oxide electrode can be realized, such diffusion of impurity through grain boundaries could be suppressed thereby and the amorphous Ru oxide electrode may also be used as the barrier metal. Thus, according to the present invention, formation of an amorphous Ru oxide was attempted.

Figure 1:
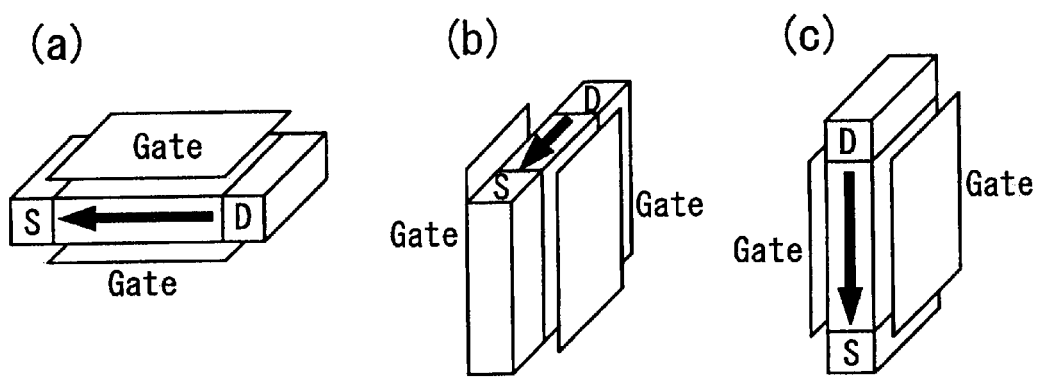
FIG. 1 shows three different types of structures of double-gate FETs.
Figure 2:
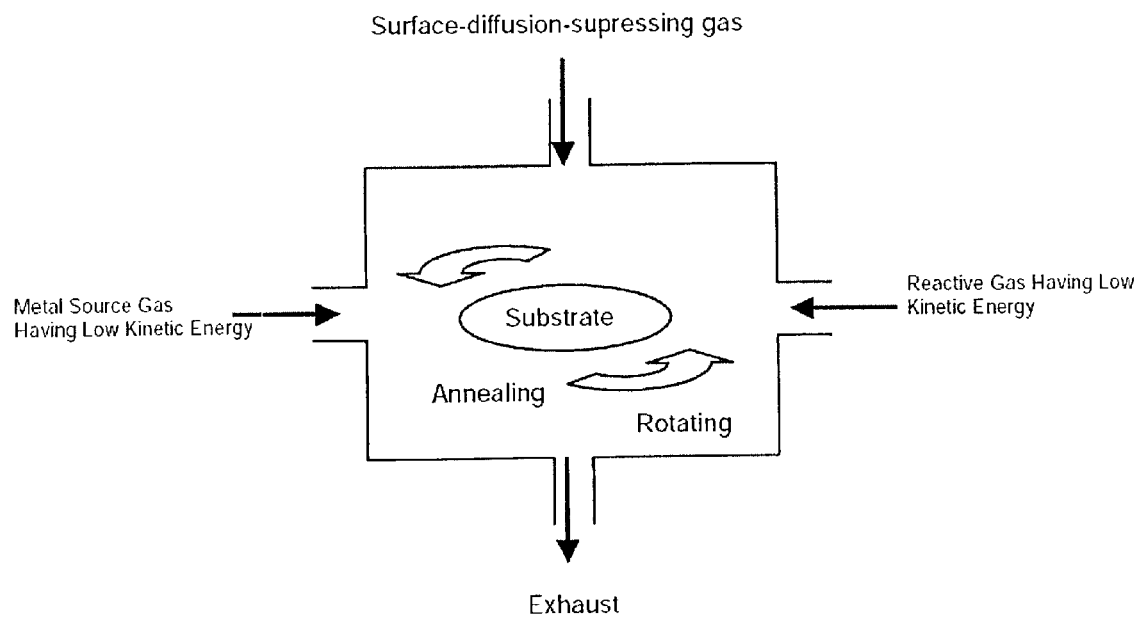
FIG. 2 shows a schematic view of CVD equipment used in the present invention.

FIG. 2 shows a schematic view of CVD equipment used in the present invention.

The organic metal $Ru(EtCp)_2$ was used as a metal source and an ozone/oxygen gas was used as a reactive oxidation gas. A $Ru(EtCp)_2$ gas was used as a metal source gas having low kinetic energy; however, other organic metals such as organic metals coordinating Cp type and COD type cyclic organic materials, β-diketone organic metals, halides and oxides having a high vapor pressure such as $RuF_6$ and $RuO_4$ or carbonyl organic metals may also be used. In short, any form other than ion species and particles having high kinetic energy may be used. Furthermore, although the ozone/oxygen gas was used as a reactive oxidation gas having low kinetic energy, any reactive oxidation gas other than gases in the state of ion species or particles high kinetic energy may be used. That is, examples of the reactive oxidation gases include atomic oxygen and nitrogen oxide, nitrogen dioxide, and ultraviolet-excited species of these reactive oxidation gases.

The above-mentioned sources were used to deposit a thin film at a low substrate temperature so that crystallization did not occur. That is, a substrate temperature was set in a range of 100° C. to 300° C. In this substrate temperature range, usually, $RuO_2$ does not grow in the presence of an oxygen gas.

Furthermore, as a surface-diffusion-suppressing gas suppressing crystallization, an inert gas as well as a source gas and a carrier gas was introduced over a surface of a substrate having a deposition face. Pressure during deposition was controlled to be between $10^{-1}$ Torr and 760 Torr, specifically, $3\times10^{-1}$ to $4\times10^{-1}$ Torr. The source gas and the carrier gas could be efficiently provided to the substrate, and the flux rate during deposition is about $10^{17}$ to $10^{18}$ molecules/cm$^2$sec in total.

Figure 3:
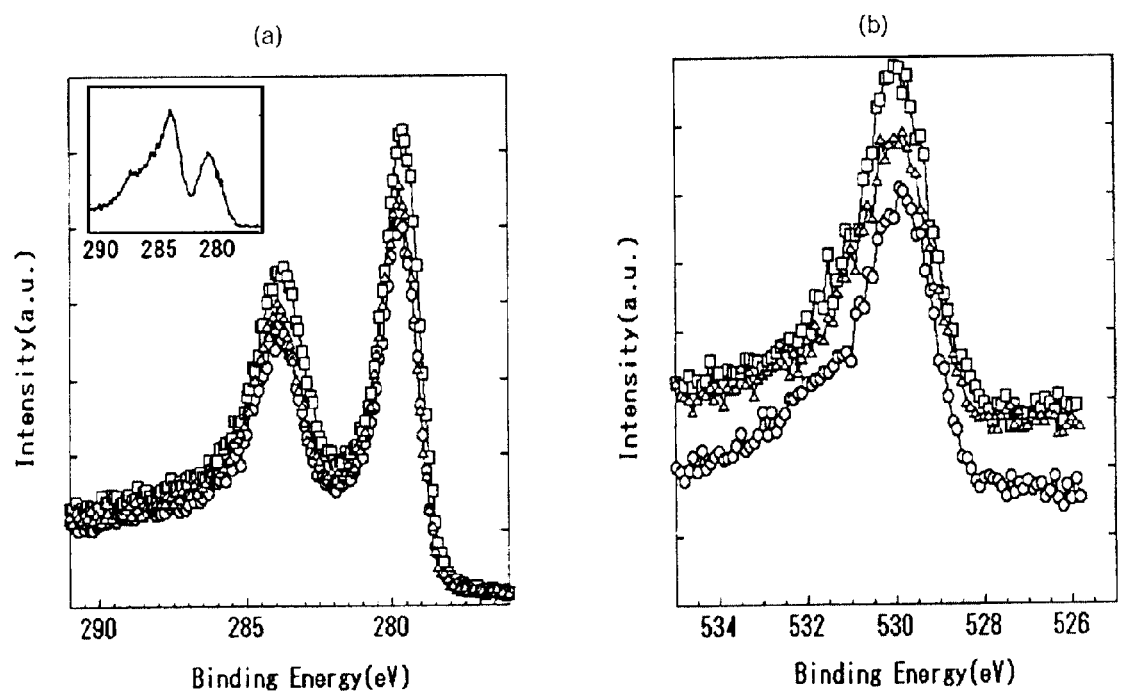
FIG. 3 shows X-ray photoelectron spectra of deposited thin films. Deposition temperatures are 150° C., 200° C., and 300° C. Surfaces of the thin films are etched about 1 nm. An inserted drawing is an X-ray photoelectron spectrum of a thin film in an as-deposited state deposited at a temperature of 100° C.

FIG. 3 shows results of X-ray photoelectron spectrometry of a thin film deposited in an as-deposited state, which is deposited at a temperature of 100° C., and results for a thin film deposited at a temperature between 150° C. and 300° C. and slightly etched on the surface (about 1 nm). FIG. 3 shows that the entire body of each of the thin films is composed of Ru and O only except for the surface portion thereof, and the inserted drawing in FIG. 3(a) shows that the thin film is deposited at a low substrate temperature as low as 100° C. That is, according to these experiments, it is confirmed that the resulting thin films were Ru oxide thin films and the films can be deposited at a low temperature as low as 100° C.

As shown in an inserted drawing in FIG. 3(a), a C-peak overlapping on a position of Ru-peak was recognized on the surface of the as-deposited thin film just after deposition. This result shows that C-impurity exists on the as-deposited surface. When the surface of the film is slightly etched with Ar ions, however, the Ru-peak alone is observed, that is, the C-peak is not observed as shown in FIG. 3(a). According to this result, it is found that the resulting thin film is composed of Ru and O as main components and since the C-impurity is an absorbed impurity exists on the surface only, few C-impurity atoms are contained in the resulting thin film. Usually, a concentration of C-impurity contained in a thin film deposited by MOCVD is at least 0.001% and the minimum detectable concentration thereof using photoelectron spectroscopy is 5%. Therefore, it is found that the concentration of the C-impurity contained in the thin film of the present EMBODIMENT would be from 0.001% to 5%.

Figure 4:
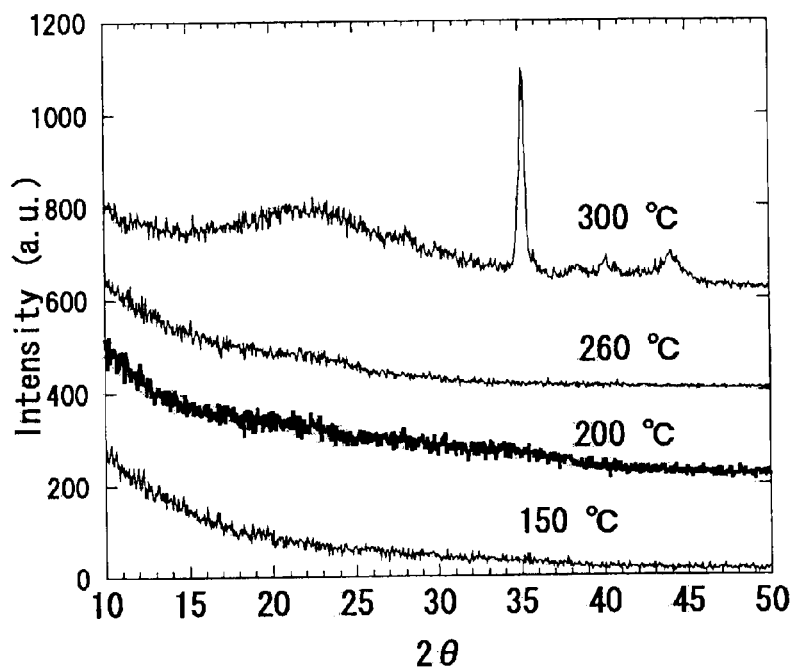
FIG. 4 shows X-ray diffraction patterns of thin films formed at deposition temperatures of 150° C., 200° C., 260° C., and 300° C.

FIG. 4 shows thin-film X-ray diffraction patterns at different deposition temperatures. According to the patterns shown in FIG. 4 and the result of θ-2θ scanning, which is commonly used, the thin film deposited at 300° C. is polycrystalline while the thin film deposited at 260° C. or lower is mostly amorphous except for a case in which an orientated film is slightly included.

Figure 5:
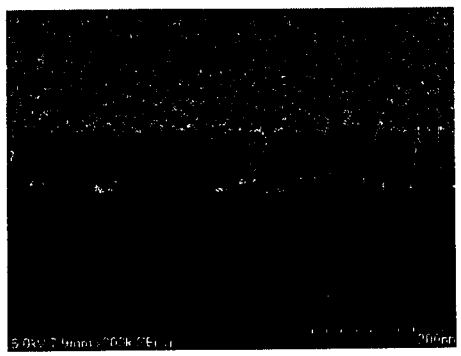
FIG. 5 shows SEM images of deposited thin films.
Figure 5:
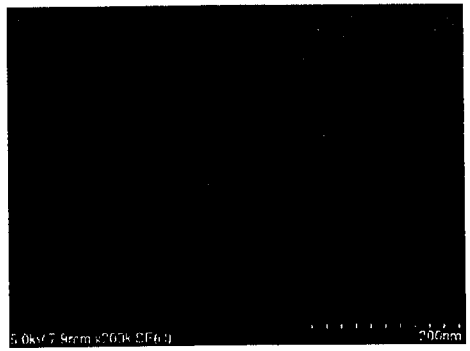
Figure 5:
Figure 5:

FIG. 5 shows SEM images of deposited thin films. The thin film deposited at 300° C. had a rough surface having clear crystal grain boundaries and reflecting the crystal structure thereof is polycrystalline. On the other hand, the thin film having an amorphous structure deposited at 260° C. or lower had a flat surface, and clear grain boundaries were not observed. It took 15 minutes at 260° C. to grow an amorphous Ru oxide thin film to a thickness of 35 nm and it took 90 minutes at 240° C. to grow an amorphous Ru oxide thin film to a thickness of 150 nm.

Results of measurements of surface morphology using an interatomic force microscope show that Rms of a thin film deposited on a Si substrate having a thermally oxidized $SiO_2$ layer formed thereon with a thickness of about 5 nm is 0.90 nm and Rms of another thin film deposited on a Si substrate having a $La_2O_3$ layer formed thereon with a thickness of about 4 nm is 0.51 nm. Rms is an abbreviation of root mean square. It is the square root of the mean of the squared value of the difference between the measurement value and the mean value.

FIG. 6 shows resistivity of thin films deposited at different temperatures by a four-terminal method. The measurements were performed at room temperature. According to FIG. 6, it is found that resistivity of the thin films can be lowered to 1 mΩcm or lower when the substrate temperature is in a range of 200° C. to 300° C. The lowest resistivity of the thin films was about 207 μΩcm.

Note that, if annealed in vacuum, the thin films having relatively flat surfaces and a resistivity less than 100 μΩcm was obtained, while the flatness of surfaces is slightly degraded. With reference to a result of X-ray diffraction, it is found that a small amount of polycrystalline metal Ru is included in the thin films in addition to an amorphous Ru oxide. Therefore, if an amorphous Ru oxide film and a polycrystalline Ru thin film are laminated together, a thin film having a resistivity of 100 μΩcm or lower, specifically 70 μΩcm, could be obtained without degradation of the flatness of the surface thereof. A sheet resistance of the resulting thin film with a thickness of 37 nm was 18.9Ω/□.

According to the results mentioned above, the amorphous Ru oxide metal, which is a compound metal having an amorphous structure and a resistivity of 1 mΩcm or lower, was obtained by providing a metal source gas having low kinetic energy, a reactive oxidation gas having low kinetic energy, and a surface-diffusion-suppressing gas to a substrate set at a temperature as low as the crystallization temperature or lower in a condition of a deposition rate and a deposition thickness are controlled so that crystallization does not occur.

Under deposition conditions similar to the present invention, an amorphous containing a thin orientated film is occasionally obtained. Unlike the polycrystalline film, the orientated film has a uniform crystal orientation in a direction perpendicular to a surface thereof and the orientated film has a far flatter surface than the polycrystalline film. Therefore, surface morphology of the above-mentioned thin film slightly including an orientated film is relatively flat while the flatness thereof is inferior to that of amorphous thin films. The thin film slightly containing an orientated film tends to have a slightly lower resistivity than the completely amorphous thin film, while the flatness of the thin film slightly containing an orientated film is slightly inferior to that of the thin film composed of the completely amorphous. Therefore, when low resistivity rather than high flatness is desired, the thin film including a thin orientated film may be useful.

In order to study an effect of the surface-diffusion-suppressing gas, a comparative experiment was conducted by performing deposition without introducing the surface-diffusion-suppressing gas at a substrate temperature of 260° C. According to the results of X-ray diffraction and SEM observation on the deposited thin film, with respect to the thin film deposited without introducing the surface-diffusion-suppressing gas, X-ray diffraction peaks indicating the presence of a polycrystalline structure and crystalline grains were observed. In addition, a surface had lower flatness. In consideration of the above, the effect of the surface-diffusion-suppressing gas is confirmed.

Next, in order to confirm applicability of the present invention to a nano-structure device, a $La_2O_3$ thin film having a thickness of about 4 nm was deposited on a silicon semiconductor fin of having a width of 18 nm and a height of 220 nm standing substantially perpendicular to the substrate, by MOCVD. Then an amorphous Ru oxide thin film having a thickness of 33 nm was deposited in-situ using the present invention. According to a cross-sectional image obtained through TEM, the structure shown in FIG. 7 was obtained. That is, when the thickness of the center portion of fin was 31.3 nm, the maximum, minimum, and average thicknesses at a position 90 nm up from the center of the fin (the upper region from the center of the fin, specifically, about 40% of the height downward from the top) were 33.2 nm, 29.3 nm, and 31.3 nm, respectively. Furthermore, the maximum, minimum, and average thicknesses at a position of 100 nm down from the center of the fin (the lower region from the center of the fin, specifically, about 45% of the height upward from the bottom) were 33.3 nm, 27.3 nm, and 31.3 nm, respectively.

In consideration of the above, by using the present invention, a semiconductor structure, in which side faces of the semiconductor standing on a substrate inclined at 70 degrees or more to the substrate are covered with amorphous compound electrodes, is formed. A ratio of the thickness of the electrode layer covering the upper portion of the side face and the thickness of the electrode layer covering the lower region thereof is about 1.0 on average, and from 0.88 to 1.2 when the maximum and minimum values of thickness measured in the upper and lower portions are used.

As mentioned above, the amorphous Ru oxide metal, which is a compound metal having an amorphous structure and a resistivity of 1 mΩcm or lower, was formed by providing a metal source gas having low kinetic energy, a reactive oxidation gas having low kinetic energy, and a surface-diffusion-suppressing gas to a substrate, which was set at a temperature as low as the crystallization temperature or lower in a condition in which a deposition rate and a deposition thickness are controlled so that crystallization does not occur.

In order to study the performance of an amorphous Ru oxide serving as a gate electrode of the present invention, a MOS structure was manufactured by depositing an amorphous Ru oxide electrode thickness of 45 nm was deposited on a silicon oxide film having a thickness of 4.4 nm formed on an n-type silicon substrate. A capacitance property was studied and a curve shown in FIG. 8 was obtained. A work function $\phi$ of the amorphous Ru oxide was 5.0 eV taking into account a concentration of impurity in the n-type silicon substrate. Furthermore, the work function of the amorphous Ru oxide, which was independently measured by the Kelvin method, was 5.2 to 5.3 eV. Furthermore, a change of the work function was measured by the Kelvin method after an annealing treatment of an amorphous Ru oxide thin film performed in hydrogen atmosphere at 200° C. for one hour so as to reduce a concentration of oxygen in the amorphous Ru oxide thin film by deoxidization. The work function of the Ru oxide thin film having the reduced concentration of oxygen was 5.0 eV. This shows that the work function of the Ru oxide thin film can be controlled using the concentration of oxygen.

From the results mentioned above, it is found that the amorphous Ru oxide has a work function $\phi$ of 5.0 to 5.3 eV and will be a useful material for p-channel electrodes having a resistivity of 1 mΩcm or lower and a surface roughness of 1 nm. Since the work function of Ru metal is known to be 4.7 eV, if the concentration of oxygen contained in the amorphous Ru oxide thin film of the present invention is more accurately controlled so that the work function thereof is controlled to be in a range of 4.7 to 5.3 eV, a threshold level of a transistor can be more strictly controlled.

The present invention is not limited to the above-mentioned embodiment and various modifications are possible without departing from the scope of the invention. That is, although an amorphous metal oxide is described in the example mentioned above, nitride, sulfide, carbide, silicide, boride, and phosphide are also applicable. For example, when the amorphous metal oxide is nitride, ammonia or atomic nitrogen can be used as a reactive nitrogen gas having low kinetic energy.

FIG. 9 shows an embodiment of the present invention and an example in which the present invention is applied to a MISFET having a high-k gate insulating film.

The example of a MISFET includes a Hf—Si—O—N film used as a fully depleted SOI substrate and a high-k gate insulator film, a laminated film composed of an amorphous $RuO_x$ film and a polycrystalline Ru film used as a first gate electrode adhered to the high-k gate dielectric film, and a polycrystalline Ru used as a plug connected to the first gate electrode so as to apply a voltage thereto. The MISFET has a structure in which an amorphous Ru film as a barrier metal for Cu wiring is deposited on the polycrystalline Ru film and the Cu wiring is deposited on the amorphous Ru film.

Note that the above-mentioned embodiment describes an example using silicon, but it is not limited to silicon. That is, examples of semiconductors other than silicon include germanium, silicon-germanium, silicon carbide, diamond, gallium arsenide, gallium nitride, zinc oxide, zinc sulfide, copper aluminate, chromium aluminate, titanium oxide, strontium titanate, indium tin oxide, indium tin gallium oxide, and organic semiconductor such as anthracene.

Furthermore, although the Hf—Si—O—N film is illustrated as a single layer film in FIG. 9, a second dielectric layer (boundary layer) may exist between a semiconductor layer and a dielectric layer. The second dielectric layer (boundary layer) may exist between an electrode and the dielectric layer. The dielectric layer may have a laminated structure composed of a plurality of dielectric layers. Amorphous is preferable for the dielectric layer, but crystalline may be used.

The electrode is preferably completely amorphous but may contain a small amount of oriented crystal grains. In such a case, the flatness of a surface of the electrode is degraded leading to an increase in the difficulty of manufacturing a three-dimensional semiconductor structure. However, as mentioned above, since resistivity of crystal or polycrystal is usually smaller than that of an amorphous structure, the resistivity of the electrode could be reduced.

The thickness of the film is preferably 2 nm or more. If the thickness is 2 nm or less, in order to reduce sheet resistance, another metal having a thickness of 2 nm or more must be laminated onto the film. This may have a negative influence on stable control of a work function. Therefore, a film having a larger thickness is suitable. If the film is excessively thick, however, strain is accumulated therein and crystallization occurs after reaching a particular thickness and may degrade the flatness. Thus, the thickness of the amorphous electrode layer constituted by the amorphous structure or a laminated structure including an amorphous structure and a polycrystalline structure is preferably from 2 nm to 1 µm, preferably from 4 nm to 150 nm, and more preferably from 5 nm to 50 nm.

The Hf—Si—O—N film is used as an insulating dielectric layer, but other high-dielectric oxide layers can be used. Examples of the insulating dielectric include a compound containing oxygen and any one or more metals selected from a group consisting of Zr, Hf, Ta, Ti, La, Gd, Y, Pr, Sc, Ba, Sr, Si, and Al, and further, the compound may contain nitrogen. For the dielectric layer, the amorphous structure layer is preferable, however, a crystal layer may be used. Furthermore, silicon oxide or silicon nitride, which is more widely used, may be used for the dielectric layer.

Note that, although the amorphous $RuO_x$ film is used as the first gate electrode adhered to the high-k dielectric film, the material of the first gate electrode is not limited to the above-mentioned $RuO_x$ if the material is an amorphous metal. As a material for the amorphous electrode, nitride and oxide are desirable, but sulfide, carbide, silicide, boride, and phosphide may be used. An amorphous metal containing an element such as Zr, Hf, Mo, Ta, Al, Ti, Zn, In, Ga, Sn, Cu, Pt, Ir, and Au may be used.

A small amount of impurity may be contained in Ru or $RuO_2$ so as to induce formation of the amorphous structure. That is, any one or more metals selected from a group of Si, Al, Ni, Ti, Zr, Hf, V, Nb, Ta, Mo, W, Ag, Mg, Zn, Pd, Sn, Ga, and In may be contained. By doping impurity, the work function can be accurately controlled. Furthermore, by doping impurity, a dielectric constant of a boundary layer between an electrode layer and a dielectric layer can be controlled.

In the embodiment of the present invention, an example of an application to a transistor is described. However, the present invention can be applied to memory devices accumulating electric charges at the trap level of the dielectric insulator by using silicon nitride, which has the trap level of carriers, as the dielectric insulator layer, and the high-dielectric oxide.

Next, an example of a method for manufacturing a semiconductor structure of the present invention is described with reference to FIG. 10.

At first, an insulating dielectric Hf—Si—O—N film, an amorphous electrode $RuO_x$ film, and a polycrystalline Ru film are laminated on a Si semiconductor substrate. Then a mask is formed by lithography. In this process, a hard mask fabricated from RIE after depositing a silicon oxide film is used (FIG. 10(a)).

Next, an electrode and an insulating film are etched by RIE to fabricate a gate structure. Then, after forming an offset spacer by depositing a silicon nitride film and etching by RIE, an extension region is ultra thinly doped by ion implantation with self-alignment technique (FIG. 10(b)).

Next, a silicon oxide film is deposited and etched by RIE to form a side wall. Then, a source-drain region is highly doped with impurity by ion implantation with self-alignment technique (FIG. 10(c)).

Next, an annealing treatment is performed for activation, a silicon oxide film is deposited by CVD, plugs serving as source and drain electrodes are buried using lithography and CVD, and then the resulting structure is flattened by CMP and an upper portion of a gate electrode is exposed (FIG. 10(d)).

After the silicon nitride film as an etch stop layer is deposited on the entire surface of the resulting structure, furthermore, a Si—O—C film as an interlayer insulator film is deposited. Then, a hole is opened at the top of the gate electrode by lithography and RIE (FIG. 10(e)).

A Ru metal layer as a seed layer for copper plating and also as a barrier layer is deposited by CVD.

Copper wirings are buried by plating and flattened by CMP. Then following steps of lamination of wiring layers are performed (FIG. 10(f)).

Note that, it is easily understood by a person skilled in the art that basic manufacturing steps, such as steps of washing Si substrates, forming p-wells or n-wells, and forming device-isolation regions are required to form transistor devices, besides the steps described in the above-mentioned example. That is, the present invention is not limited to the above-mentioned embodiment and various modifications are possible without departing from the scope of the invention. Furthermore, although CVD is used in the example as a step of depositing an amorphous Ru oxide thin film of the present invention, depositing is not limited to CVD. CVD or atomic layer deposition (ALD) is preferable, but sputtering may be used. While sputtering is inferior to CVD in step coverage and has difficulties to manufacture three-dimensionally structured bodies, sputtering is easier than CVD and cost reduction can be achieved. If sputtering is used for deposition, as mentioned above, an electric and structural shield plate is required to prevent high-energy particles and ion particles from incoming onto a substrate. Therefore, although a cost can be reduced to a lower level than CVD, a capital cost for introducing equipment would be higher than ordinary sputtering and a maintenance cost is also required.

Embodiment 2

FIG. 11 shows another embodiment of the present invention and an example applying the present invention to a MISFET having a high-k gate insulating film.

The example of a MISFET shown in FIG. 11 includes Hf—Al—O—N used as a fully-depleted SOI substrate and a high-k gate dielectric film, a laminated film composed of an amorphous $RuO_x$ film and a polycrystalline Ru film used as a first gate electrode adhering the high-k gate dielectric film, and a polycrystalline Ru used as a plug connecting the first gate electrode so as to apply a voltage thereto. The MISFET has a structure in which an amorphous Ru film as a barrier metal for Cu wiring is deposited on the polycrystalline Ru film and the Cu wiring is deposited on the amorphous Ru film.

The above-mentioned embodiment describes an example using silicon, however, it is not limited to the silicon. That is, examples of semiconductors other than silicon include germanium, silicon-germanium, silicon carbide, diamond, gallium arsenide, gallium nitride, zinc oxide, zinc sulfide, copper aluminate, chromium aluminate, titanium oxide, strontium titanate, indium tin oxide, indium tin gallium oxide, and organic semiconductor such as anthracene.

Furthermore, although the Hf—Al—O—N film is illustrated as a single layer film in FIG. 11, a second dielectric layer (boundary layer) may exist between a semiconductor layer and a dielectric layer. The second dielectric layer (boundary layer) may exist between an electrode and the dielectric layer. The dielectric layer may have a laminated structure composed of a plurality of dielectric layers. Amorphous is preferable for dielectric layer, but crystalline may be used.

The electrode is preferably completely amorphous but may contain a small amount of oriented crystal grains. In such a case, a flatness of a surface of the electrode will be degraded leading to an increase in difficulty for manufacturing a three-dimensional semiconductor structure. However, as mentioned above, since resistivity of crystal or polycrystal is usually smaller than that of an amorphous structure, the resistivity of the electrode may be reduced.

A thickness of the film is preferably 2 nm or more. If the thickness thereof is 2 nm or less, in order to reduce sheet resistance, another metal having a thickness of 2 nm or more must be laminated. This may have a negative influence on stable control of a work function. Therefore, the film having a larger thickness is suitable. If the film has an excessively large thickness, however, strain is accumulated therein and crystallization occurs after reaching a particular thickness and may degrade the flatness. Thus, the thickness of the film is preferably from 2 nm to 1 µm, more preferably from 4 nm to 150 nm, and further more preferably from 5 nm to 50 nm.

The Hf—Al—O—N film is used as an insulating dielectric layer; however, other high-dielectric oxide layers can be used. Examples of the insulating dielectric include a compound having oxygen and any one or more metals selected from a group consisting of Zr, Hf, Ta, Ti, La, Gd, Y, Pr, Sc, Ba, Sr, Si, and Al, and further, the compound may contain nitrogen. For the dielectric layer, an amorphous structure layer is preferable, but a crystal layer may be used. Furthermore, silicon oxide or silicon nitride, which is more widely used, may be used for the dielectric layer.

Note that, although the amorphous $RuO_x$ film is used as a laminated gate electrode, a material of the laminated gate electrode is not limited to the above-mentioned $RuO_x$ if the material is an amorphous metal. As a material for an amorphous electrode, nitride and oxide are desirable, but sulfide, carbide, silicide, boride, and phosphide may be used. An amorphous metal containing an element such as Zr, Hf, Mo, Ta, Al, Ti, Zn, In, Ga, Sn, Cu, Pt, Ir, and Au may be used.

A small amount of impurity may be contained in Ru or $RuO_2$ so as to induce formation of the amorphous structure. That is, any one or more metals selected from a group of Si, Al, Ni, Ti, Zr, Hf, V, Nb, Ta, Mo, W, Ag, Mg, Zn, Pd, Sn, Ga, and In may be contained. By doping impurity, a work function can be accurately controlled. Furthermore, by doping impurity, a dielectric constant of a boundary layer between the electrode layer and the dielectric layer can be controlled.

In the embodiment of the present invention, an example of applications to a transistor is described. However, the present invention can be applied to memory devices by using silicon nitride, which has a trap level of carriers and serves as the insulating dielectric layer, and the high-dielectric oxide.

FIG. 12 shows an example of a method for manufacturing a semiconductor structure mentioned above.

At first, by using an ordinary self-alignment process, a MOSFET composed of a gate electrode made of polysilicon and a gate dielectric film made of $SiO_2$ is manufactured. Then, after depositing a silicon oxide film by CVD or an applying method, the gate electrode is exposed by etchbacking (FIG. 12(a)).

The gate electrode composed of polysilicon and the gate insulating film are removed by etching so as to expose a channel region and then washed. The gate insulating film composed of the Hf—Al—O—N film and the gate electrode composed of the amorphous $RuO_x$ film and the polycrystalline Ru film are sequentially laminated by CVD (FIG. 12(b)). After flattening by CMP, a silicon nitride film as an etch stop layer and a Low-k material film as an interlayer insulator film are sequentially laminated (FIG. 12(c)).

By using lithography, a hole is opened over the gate and then, a Ru metal layer serving as a seed layer for copper plating and also a barrier layer is deposited by CVD.

Copper wirings are buried by plating and flattened by CMP. Then following steps of lamination of wiring layers are performed (FIG. 12(d)).

The present invention is not limited to the above-mentioned embodiment and various modifications are possible without departing from the scope of the invention. Furthermore, although CVD is used in the example as a step of depositing an amorphous Ru oxide thin film of the present invention, the depositing is not limited to CVD. CVD or ALD is preferable, but sputtering may be used. While sputtering is inferior to CVD in step coverage and has difficulties to manufacture a three dimensionally structured body, sputtering is easier than CVD and cost reduction can be achieved. If sputtering is used for deposition, as mentioned above, an electric and structural shield plate is required to prevent high-energy particles and ion particles from incoming onto the substrate. Therefore, although a cost can be reduced to a lower level than CVD, capital cost for introducing equipment would be higher than ordinary sputtering and maintenance cost may be additionally required.

Embodiment 3

FIG. 13 shows another embodiment of the present invention and an example applying the present invention to a memory device having a floating gate.

The example shown in the drawing includes a Si substrate, silicon oxide, a Hf—Si—O—N film as a high-k gate insulating film, a laminated film composed of an amorphous $RuO_x$ film and a polycrystalline Ru film serving as a floating gate electrode held between the silicon oxide and the high-k gate insulating film, and an amorphous TiN film serving as a control gate electrode (a plug, barrier metal, and wiring metal are not shown in the drawing).

Note that the above-mentioned embodiment describes an example using silicon, however, it is not limited to the silicon. That is, examples of semiconductors other than silicon include germanium, silicon-germanium, silicon carbide, diamond, gallium arsenide, gallium nitride, zinc oxide, zinc sulfide, copper aluminate, chromium aluminate, titanium oxide, strontium titanate, indium tin oxide, indium tin gallium oxide, and organic semiconductor such as anthracene.

Furthermore, although a single layer film of high-k dielectric film is illustrated as a dielectric layer in FIG. 13, a second dielectric layer (boundary layer) may exist between the floating gate and the dielectric layer. The second dielectric layer (boundary layer) may exist between an electrode and the dielectric layer. The dielectric layer may have a laminated structure composed of a plurality of dielectric layers. Amorphous is preferable for dielectric layer, but crystalline may be used.

The electrode is preferably completely amorphous but may contain a small amount of oriented crystal grains. In such a case, a flatness of a surface of the electrode will be degraded leading to an increase in difficulty for manufacturing a three-dimensional semiconductor structure. However, as mentioned above, since resistivity of crystal or polycrystal is usually smaller than that of an amorphous structure, the resistivity of the electrode may be reduced.

Although a combination of a $SiO_2$ film and an HfSiON film is used as a dielectric insulator layer, another high-dielectric oxide layer composed of another combination may be used. Examples of the insulating dielectric include a compound having oxygen and any one or more metals selected from a group consisting of Zr, Hf, Ta, Ti, La, Gd, Y, Pr, Sc, Ba, Sr, Si, and Al, and further, the compound may contain nitrogen. Any combination of insulating dielectrics may be used. For the dielectric layer, an amorphous structure layer is preferable, however, a crystal layer may be used.

Note that, the amorphous $RuO_x$ film is used as the floating gate electrode, a material for the floating gate electrode is not limited to the above-mentioned $RuO_x$ if the material is an amorphous metal. As the material for the amorphous electrode, nitride and oxide are desirable, however, sulfide, carbide, silicide, boride, and phosphide may be used. The amorphous metal containing an element such as Zr, Hf, Mo, Ta, Al, Ti, Zn, In, Ga, Sn, Cu, Pt, Ir, and Au may be used.

A small amount of impurity may be contained in Ru or $RuO_2$ so as to induce formation of the amorphous structure. That is, any one or more metals selected from a group of Si, Al, Ni, Ti, Zr, Hf, V, Nb, Ta, Mo, W, Ag, Mg, Zn, Pd, Sn, Ga, and In may be contained. By doping impurity, the work function can be accurately controlled.

FIG. 14 shows an example of a method for manufacturing the above-mentioned semiconductor structure.

By using a similar method to that shown in FIG. 10, a thermal oxide film, a laminated film composed of a Ru film and an amorphous $RuO_x$ film, an Hf—Si—O—N film, and a TiN film are laminated sequentially on a silicon substrate. Then, a gate structure is formed using a silicon oxide film as a hard mask (FIG. 14(a)).

Similarly to a process shown in FIG. 10, after etching an electrode and an insulator film by RIE to fabricate a gate structure, extension doping, formation of a side wall, source/drain doping are performed (FIG. 14(b)). Then annealing for activation, deposition of the silicon oxide film, formation of a burried electrode plug, flattening by CMP, deposition of silicon carbide, deposition of an interlayer insulator film (Si—O—C), formation of a hole over the gate electrode, deposition of the TiN film, deposition of the Ru film, and formation of a buried Cu film (FIG. 14(c)) are performed.

Although CVD is used in the example, the present invention is not limited to CVD. CVD or ALD is preferable, but sputtering may be used. While sputtering is inferior to CVD in step coverage and has difficulties to manufacture a three dimensionally structured body, sputtering is easier than CVD and cost reduction can be achieved. Furthermore, when sputtering is used, it may preferably be performed for a substrate having a low temperature, under a high pressure and with high power. If the power is excessively high, however, an underlayer gate insulating film is undesirably damaged.

FIG. 15 shows an example of an amorphous electrode of the present invention applied to finFETs. FIG. 15(a) shows a cross-sectional view showing a face vertical to the direction of source-drain current in a finFET (hereinafter referred to as a G-G cross section). FIG. 15(b) shows a cross-sectional view showing a face parallel to the direction of source-drain current in the finFET (hereinafter referred to as an S-D cross section). A semiconductor structure has a Si semiconductor standing of a SOI substrate and having two faces covered with a La silicate film of a high-k gate insulating film and a laminate film gate electrode composed of an amorphous $RuO_2$/polycrystalline Ru film. Furthermore, a $SiO_2$ insulative protection film is deposited on the semiconductor structure.

The above-mentioned embodiment describes an example using silicon, but not limited to the silicon. That is, examples of semiconductors other than silicon include germanium, silicon-germanium, silicon carbide, diamond, gallium arsenide, gallium nitride, zinc oxide, zinc sulfide, copper aluminate, chromium aluminate, titanium oxide, strontium titanate, indium tin oxide, indium tin gallium oxide, and organic semiconductor such as anthracene.

Furthermore, although the La silicate film is illustrated as a single layer film in FIG. 15, a second dielectric layer (boundary layer) may exist between a semiconductor layer and a dielectric layer. The second dielectric layer (boundary layer) may exist between an electrode and the dielectric layer. The dielectric layer may have a laminated structure composed of a plurality of dielectric layers. Amorphous is preferable for the dielectric layer, but crystalline may be used.

The electrode is preferably completely amorphous but may contain a small amount of oriented crystal grains. In such a case, a flatness of a surface of the electrode will be degraded leading to an increase in difficulty for manufacturing a three-dimensional semiconductor structure. However, as mentioned above, since resistivity of crystal or polycrystal is usually smaller than that of an amorphous structure, the resistivity of the electrode may be reduced.

A thickness of the film is preferably 2 nm or more. If the thickness thereof is 2 nm or less, in order to reduce sheet resistance, another metal having thickness of 2 nm or more must be laminated. This may have a negative influence on stable control of a work function. Therefore, the film having larger thickness is suitable. If the film has an excessively large thickness, however, strain is accumulated therein and crystallization occurs after reaching a particular thickness and may degrade the flatness. Thus, the thickness of the film is preferably from 2 nm to 1 μm, more preferably from 4 nm to 150 nm, and further more preferably from 5 nm to 50 nm.

The La silicate layer is used as an insulating dielectric, but other high-dielectric oxide layers and existing silicon oxide layers can be used. Examples of the insulating dielectric include a compound having oxygen and any one or more metals selected from a group consisting of Zr, Hf, Ta, Ti, La, Gd, Y, Pr, Sc, Ba, Sr, Si, and Al, and further, the compound may contain nitrogen. The amorphous structure layer is preferable for the dielectric layer, but a crystal layer may be used. Furthermore, silicon oxide or silicon nitride, which is widely used, may be used for the dielectric layer.

Note that, although the amorphous $RuO_x$ film is used as the first gate electrode, the material of the first gate electrode is not limited to the above-mentioned $RuO_x$ if the material is an amorphous metal. As a material for the amorphous electrode, nitride and oxide are desirable, but sulfide, carbide, silicide, boride, and phosphide may be used. The amorphous metal containing an element such as Zr, Hf, Mo, Ta, Al, Ti, Zn, In, Ga, Sn, Cu, Pt, Ir, and Au may be used.

A small amount of impurity may be contained in Ru or $RuO_2$ so as to induce formation of the amorphous structure. That is, any one or more metals selected from a group of Si, Al, Ni, Ti, Zr, Hf, V, Nb, Ta, Mo, W, Ag, Mg, Zn, Pd, Sn, Ga, and In may be contained. By doping impurity, the work function can be accurately controlled. Furthermore, by doping impurity, a dielectric constant of a boundary layer between an electrode layer and a dielectric layer can be controlled.

In the embodiment of the present invention, an example of applications to a transistor is described. However, the present invention can be applied to memory devices by using silicon nitride, which has the trap level of carrier and serves as the insulating dielectric layer, and the high-dielectric oxide.

FIG. 16 shows an example of a method for manufacturing the semiconductor structure mentioned above.

At first, a semiconductor Fin standing on a substrate is manufactured by wet etching or dry etching (FIG. 16(a)). Next, a La silicate film, a $RuO_x$ film, a polycrystalline Ru film, and a silicon oxide film for a hard mask are deposited on the semiconductor Fin by CVD. Then, a gate structure is formed by lithography (FIGS. 16(b) and (c)).

An extension region is doped with impurity by ion implantation with self-alignment technique. Then, a sidewall is formed by depositing and etching the silicon oxide film and a source-drain region is doped with impurity (FIG. 16(d)). Then, after depositing an interlayer insulator film (FIG. 16(e)), and a hole is opened over the source, drain, and gate, and a metal plug is deposited (FIG. 16(f)).

The present invention is not limited to the above-mentioned embodiment and various modifications are possible without departing from the scope of the invention. Furthermore, although CVD is used in the example as a step of depositing an amorphous Ru oxide thin film of the present invention, depositing is not limited to the CVD. CVD or ALD is preferable, but sputtering may be used. While sputtering is inferior to CVD in step coverage and has difficulties to manufacture a three dimensionally structured body, sputtering is easier than CVD and cost reduction can be achieved. Furthermore, when sputtering is used, it may preferably be performed for the substrate at a low temperature, under a high pressure and with high power. If the power is excessively high, however, an underlayer gate insulating film is undesirably damaged.

The embodiment of the present invention describes the so-called FinFET structure in which a semiconductor channel is entirely covered except for one face. However, by polishing a top face of the structure shown in FIG. 16(f) by CMP (FIG. 17(g)), the so-called separate type double-gate transistor structure, in which gate electrodes on both faces thereof are electrically separated, can be obtained (FIG. 17(h)). If a transistor is a separate type double-gate transistor, when the same voltage is applied to gate electrodes, the similar characteristic to a finFET can be obtained and when the different voltages are independently applied to each of the gate electrodes, by using one gate electrode as a control electrode, the transistor can be operated as a transistor having an electrically controllable threshold.

The example of the separate type double-gate transistor shown in FIG. 17 has an amorphous $RuO_x$/polycrystalline Ru film on both of separated two gates because the separate type double-gate transistor is manufactured by polishing the top of the finFET shown in FIG. 15 by CMP. Here, an amorphous $RuO_x$ film may be disposed on only one of the gate electrodes while a different polycrystalline metal is disposed on the other gate electrode. In such a case, although the above-mentioned problems concerning flatness of surfaces and diffusion of impurity may occur, the threshold may be accurately controlled by using a metal having a different work function.

Embodiment 4

FIG. 18 shows an example of an amorphous gate electrode of the present invention applied to a vertical FET. FIG. 18 shows a cross-sectional view showing a face vertical to the direction of source-drain current in the vertical FET. The semiconductor structure has a Si standing on $SiO_2$ of a SOI substrate and having two faces covered with a $La_2O_3$ film of a high-k gate insulating film and a laminate film gate electrode composed of an amorphous $RuO_2$/polycrystalline Ru film. Furthermore, $SiO_2$ insulative protection film is deposited on the semiconductor structure.

The above-mentioned embodiment describes an example using silicon, but not limited to the silicon. That is, examples of semiconductors other than silicon include germanium, silicon-germanium, silicon carbide, diamond, gallium arsenide, gallium nitride, zinc oxide, zinc sulfide, copper aluminate, chromium aluminate, titanium oxide, strontium titanate, indium tin oxide, indium tin gallium oxide, and organic semiconductor such as anthracene.

Furthermore, although the high-k gate insulating film is used as a single layer film in FIG. 18, a second dielectric layer (boundary layer) may exist between a semiconductor and a dielectric layer. The second dielectric layer (boundary layer) may exist between an electrode and the dielectric layer. The dielectric layer may have a laminated structure composed of a plurality of dielectric layers. Amorphous is preferable for the dielectric layer, but crystalline may be used.

The electrode is preferably completely amorphous but may contain a small amount of oriented crystal grains. In such a case, a flatness of a surface of the electrode is degraded leading to an increase in difficulty for manufacturing a three-dimensional semiconductor structure. However, as mentioned above, since resistivity of crystal or polycrystal is usually smaller than that of an amorphous structure, the resistivity of the electrode may be reduced.

A thickness of the film is preferably 2 nm or more. If the thickness thereof is 2 nm or less, in order to reduce sheet resistance, another metal having a thickness of 2 nm or more must be laminated. This may have a negative influence on stable control of a work function. The thickness of the film is preferably from 2 nm to 1 μm, more preferably from 4 nm to 150 nm, and further more preferably from 5 nm to 50 nm.

The $La_2O_3$ film is used as an insulating dielectric, but other high-dielectric oxide layer or an ordinary silicon oxide layer can be used. Examples of the insulating dielectric include a compound having oxygen and any one or more metals selected from a group consisting of Zr, Hf, Ta, Ti, La, Gd, Y, Pr, Sc, Ba, Sr, Si, and Al, and further, the compound may contain nitrogen. For the dielectric layer, the amorphous structure layer is preferable, but a crystal layer may be used. Furthermore, silicon oxide or silicon nitride, which is widely used, may be used for the dielectric layer.

Although the amorphous $RuO_x$ film is used as the first gate electrode, the material of the first gate electrode is not limited to the above-mentioned $RuO_x$ if the material is an amorphous metal. As a material for the amorphous electrode, nitride and oxide are desirable, but sulfide, carbide, silicide, boride, and phosphide may be used. The amorphous metal containing an element such as Mo, Ta, Al, Ti, Zn, In, Ga, Sn, Cu, Pt, Ir, and Au may be used.

A small amount of impurity may be contained in Ru or $RuO_2$ so as to induce formation of the amorphous structure.

That is, any one or more metals selected from a group of Si, Al, Ni, Ti, Zr, Hf, V, Nb, Ta, Mo, W, Ag, Mg, Zn, Pd, Sn, Ga, and In may be contained. By doping impurity, the work function can be accurately controlled. Furthermore, by doping impurity, a dielectric constant of a boundary layer between an electrode layer and a dielectric layer can be controlled.

In the embodiment of the present invention, an example of applications to a transistor is described. However, the present invention can be applied to memory devices by using silicon nitride, which has the trap level of carrier as the insulating dielectric layer, and the high-dielectric oxide (for example, high-dielectric oxide including Al atoms).

FIG. 19 shows an example of a method for manufacturing a semiconductor structure mentioned above.

At first, a semiconductor fin standing on a substrate is manufactured by wet etching or dry etching. Then, a source-drain region is formed by ion implantation in an upper portion of the fin and a semiconductor substrate having the fin standing thereon (FIG. 19(a)). Next, after the width of the fin is reduced by etching, a $La_2O_3$ layer, $RuO_x$ layer, and polycrystalline Ru layer are laminated on the semiconductor fin by CVD (FIG. 19(b)), and formed into a gate electrode structure by RIE (FIG. 19(c)). Then, an interlayer insulating film is deposited by CVD (FIG. 19(d)) and holes are opened at source-drain regions by lithography. A $La_2O_3$ a high-k gate dielectric film is used as an etch stop layer. A silicon surfaces are exposed by etching the $La_2O_3$ film (FIG. 19(e)) and source and drain electrodes are formed (FIG. 19(f)).

Note that, it is easily understood by a person skilled in the art that basic manufacturing steps, such as steps of washing Si substrates, forming p-wells or n-wells, and forming device-isolation regions are required to form transistor devices, besides the steps described in the above-mentioned embodiment. That is, the present invention is not limited to the above-mentioned embodiment and various modifications are possible without departing from the scope of the invention. Furthermore, although CVD is used in the example as a step of depositing an amorphous Ru oxide thin film of the present invention, depositing is not limited to the CVD. CVD or ALD is preferable, but sputtering may be used. While sputtering is inferior to CVD in step coverage and has difficulties to manufacture a three dimensionally structured body, sputtering is easier than CVD and cost reduction can be achieved. Furthermore, when sputtering is used, it may preferably be performed for a substrate at a low temperature, under a high pressure and with high power. If the power is excessively high, however, an underlayer gate insulator film is undesirably damaged.

The invention claimed is:

1. A semiconductor structure comprising:
a semiconductor;
a dielectric layer covering the semiconductor; and
an electrode layer covering the dielectric layer, wherein
the electrode layer has an amorphous structure with a surface roughness of 1 nm or less and a resistivity of 1 mΩcm formed by metal-organic chemical vapor deposition (MOCVD) method or atomic layer deposition (ALD) by using activated particles,
the semiconductor is arranged to stand on a substrate, and
the dielectric layer and the electrode layer cover at least one side face of the semiconductor.

2. The semiconductor structure according to claim 1, wherein a part of or the entirety of the electrode layer covers a side face standing inclined at from 70° to 90° to the substrate, and a ratio of the thickness of the electrode layer covering an upper portion of the side face to the thickness of the electrode layer covering a lower portion of the side face is in a range of 0.9 to 1.2.

3. The semiconductor structure according to claim 1, wherein the electrode layer is a Ru oxide.

4. The semiconductor structure according to claim 1, wherein resistivity of the electrode layer is between 70 μΩcm and 1 mΩcm.

5. The semiconductor structure according to any one of claims 1, 2, 3 and 4, wherein the semiconductor structure configures a memory device having a threshold voltage controlled by trapped electric charges at trap levels in the dielectric layer.

6. The semiconductor structure according to any one of claims 1, 2, 3 and 4, wherein the amorphous structure of the electrode layer contains from 0.001% to 5% of carbon.

* * * * *